United States Patent [19]
Solis et al.

[11] Patent Number: 5,814,155
[45] Date of Patent: Sep. 29, 1998

[54] PLASMA ASHING ENHANCEMENT

[75] Inventors: Ramiro Solis; Mark Arnold Levan, both of San Antonio, Tex.

[73] Assignee: VLSI Technology, Inc., San Jose, Calif.

[21] Appl. No.: 672,477

[22] Filed: Jun. 26, 1996

[51] Int. Cl.$^6$ ....................................................... C25F 1/00
[52] U.S. Cl. .................................. 134/1; 134/1.1; 134/2; 134/3
[58] Field of Search .................................. 134/1, 1.1, 2, 3

[56] References Cited

U.S. PATENT DOCUMENTS

| | | | |
|---|---|---|---|
| 4,786,352 | 11/1988 | Benzing | 134/1.1 |
| 4,853,081 | 8/1989 | Mlynko | 134/1.1 |
| 5,198,634 | 3/1993 | Mattson et al. | 134/1.1 |
| 5,647,953 | 7/1997 | Williams et al. | 134/1.1 |

*Primary Examiner*—Lyle A. Alexander
*Attorney, Agent, or Firm*—Wagner, Murabito & Hao

[57] ABSTRACT

A method for enhancing sidewall polymer removal. In one embodiment of the present invention, $O_2$ is introduced into an ashing environment at a flow rate of approximately 800 standard cubic centimeters per minute (SCCM). In the present embodiment, $CF_4$ is also introduced into the ashing environment. The $CF_4$ is introduced at a flow rate of approximately 80 SCCM. The ashing environment also has $H_2O$ vapor introduced therein. In the present embodiment, the $H_2O$ vapor is introduced into the ashing environment at a flow rate of approximately 80 SCCM. The ashing environment is used to selectively etch sidewall polymer material, thereby providing a method for removing sidewall polymer material without detrimentally etching other materials.

17 Claims, 4 Drawing Sheets

PLASMA ASHING ENHANCEMENT

TECHNICAL FIELD

The present claimed invention relates to the field of semiconductor device fabrication. More specifically, the present claimed invention relates to the removal or ashing of sidewall polymer material.

BACKGROUND ART

During conventional semiconductor manufacturing processes, unwanted materials are formed on the semiconductor wafer and on features formed on the semiconductor wafer. Usually, these unwanted materials must be removed or etched from the semiconductor wafer. Unfortunately, not all unwanted materials are easily removed or etched from the semiconductor wafer or the features formed on the semiconductor wafer.

With reference now to Prior Art FIG. 1A, a cross sectional view of a semiconductor substrate 10 having features formed thereon is shown. Semiconductor substrate 10 has a first alloy layer 12 and a second alloy layer 14 formed thereon. A first metal line 16 is disposed on top of first alloy layer 12, and a second metal line 18 is disposed on top of second alloy layer 14. Photoresist layers 20 and 22 cover first and second metal lines 16 and 18, respectively. It will be understood that various other features, such as, for example, an oxide layer on semiconductor wafer 10, are not shown for purposes of clarity.

With reference still to Prior Art FIG. 1A, first metal line 16 has sidewall polymers 24a and 24b formed thereon. Likewise, second metal line 18 has sidewall polymers 26a and 26b formed thereon. Sidewall polymers 24a, 24b, 26a, and 26b are formed during the metal etch step used to form metal lines 16 and 18. Specifically, sidewall polymers 24a, 24b, 26a, and 26b are formed by the etching species such as, for example, $CHF_3$, $C_2H_6$, and the like, used to form metal lines 16 and 18. Additionally, sidewall polymers 24a, 24b, 26a, and 26b contain carbon present in the photoresist mask which defines the metal etch step. As a result, sidewall polymers 24a, 24b, 26a, and 26b are comprised of long-chain hydrocarbon polymers. Furthermore, sidewall polymers often have metallic components embedded therein. The metal components were liberated during the metal etch step from, for example, the metal of metal lines 16 and 18, or the metal in alloy layers 12 and 14.

With reference next to Prior Art FIG. 1B, after the metal etch step, the remaining portions of photoresist 20 and 22 of Prior Art FIG. 1A are removed in an ashing step. For purposes of the present application, the term ashing will refer to the removal of a substantially carbon-based material such as, for example, photoresist. Etching, on the other hand, will refer to the removal of other materials which are not substantially carbon-based. A conventional ashing operation does not remove sidewall polymer material. Thus, as shown in Prior Art FIG. 1B, sidewall polymers 24a, 24b, 26a, and 26b remain behind after photoresist portions 20 and 22 are removed. That is, portions 28 of sidewall polymers 24a, 24b, 26a, and 26b are left unsupported. The unsupported portions can break off and contaminate the semiconductor wafer and features formed thereon.

Referring next to Prior Art FIG. 1C, sidewall polymers 24a, 24b, 26a, and 26b can separate completely from the metal line and form a current leakage path. That is, sidewall polymers 24a, 24b, 26a, and 26b may be conductive due to having metal components embedded therein. Thus, when, for example, sidewall polymers 24b and 26a separate break away from their respective metal lines as shown in Prior Art FIG. 1C, an unwanted current path is generated between metal lines 16 and 18. It will be understood to those of ordinary skill in the art, that numerous other deleterious conditions are created sidewall polymers contamination.

It is well known in the art, that the presence of sidewall polymer material affects the reliability of the semiconductor devices or features formed on the semiconductor wafer. Specifically, if unremoved, the sidewall polymers can cause defects in overlying inter-metal oxides (IMOs). These defects, in turn, allow for the migration of metal through the IMO. Thus, sidewall polymers must be removed. In one prior art attempt to remove sidewall polymer material, the semiconductor wafer and the features formed thereon are subjected to a wet strip step. The wet strip step uses an organic solvent in an attempt to remove the sidewall polymer material. Although long-chain hydrocarbons are generally soluble in such organic solvents, impurities in the sidewall polymer material, such as metal components or oxides, reduce the effectiveness of the organic solvents. Furthermore, wet strip steps are not completely effective even when the sidewall material does not contain impurities. That is, portions of the sidewall polymers are often left behind after the wet strip step. As yet another disadvantage, organic solvents are highly aggressive towards aluminum. Thus, organic solvents can etch and/or damage aluminum containing features such as metal lines. In order to reduce the etching or damage to the aluminum containing features, the amount of time during which the organic solvent is applied is reduced. Additionally, the temperature at which the organic solvent is applied to the semiconductor wafer and the features thereon is reduced. By reducing the time and temperature of the wet strip step, the etching of and/or damage to the aluminum containing features is reduced. However, reducing the time and temperature of the wet strip step also reduces the effectiveness of the wet strip step.

In another attempt to remove sidewall polymer material, $CF_4$ has been added to a conventional $O_2$-based plasma ashing environment. As stated above, an ashing environment is used to remove carbon-based materials such as photoresist. The addition of $CF_4$ facilitates the removal of impurities such as are found in sidewall polymer material. Thus, the $O_2/CF_4$ ashing environment removes both photoresist and sidewall polymer material. Unfortunately, an $O_2/CF_4$ ashing environment also etches other species such as, for example, metal alloy layers 12 and 14 of Prior Art FIGS. 1A–1C, and oxides present on semiconductor wafer 10. Additionally, some prior art approaches employ both O2/CF4 ashing and an organic wet strip step in an attempt to remove sidewall polymer material.

Thus, the need has arisen for a method which effectively removes sidewall polymer material without deleteriously etching other material.

DISCLOSURE OF THE INVENTION

It is therefore an object of the present invention to provide a method which effectively removes sidewall polymer material without deleteriously etching other material. The present invention achieves the above accomplishments with an ashing method which utilizes $H_2O$ vapor to realize selective ashing of sidewall polymer material.

Specifically, in one embodiment of the present invention, $O_2$ is introduced into an ashing environment. In the present embodiment, $CF_4$ is also introduced into the ashing environment. The ashing environment also has $H_2O$ vapor introduced therein. The ashing environment is used to selectively ash sidewall polymer material, thereby providing a method for removing sidewall polymer material without detrimentally etching other materials.

In another embodiment of the present invention, $CF_4$ is also introduced into the ashing environment of the above-described embodiment. As in the previous embodiment, the ashing environment is used to selectively ash sidewall polymer material, thereby providing a method for removing sidewall polymer material without detrimentally etching other materials.

In yet another embodiment of the present invention, $O_2$ is introduced into an ashing environment at a flow rate of approximately 800 standard cubic centimeters per minute (SCCM). In the present embodiment, $CF_4$ is also introduced into the ashing environment. The $CF_4$ is introduced at a flow rate of approximately 80 SCCM. The ashing environment also has $H_2O$ vapor introduced therein at a flow rate of approximately 80 SCCM. Again, the ashing environment is used to selectively ash sidewall polymer material, thereby providing a method for removing sidewall polymer material without detrimentally etching other materials.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1A:
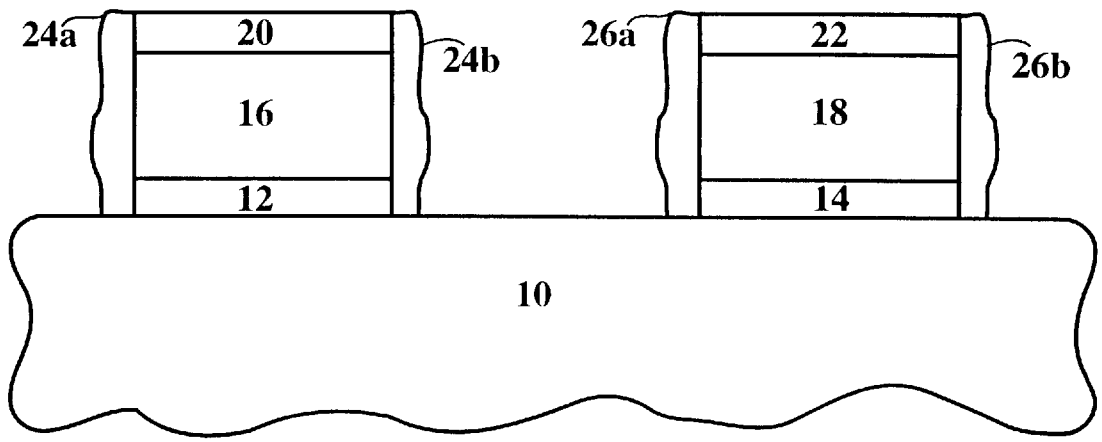
FIGS. 1A, 1B and 1C are cross sectional views illustrating steps associated with prior art sidewall polymer formation and removal methods.
Figure 1B:
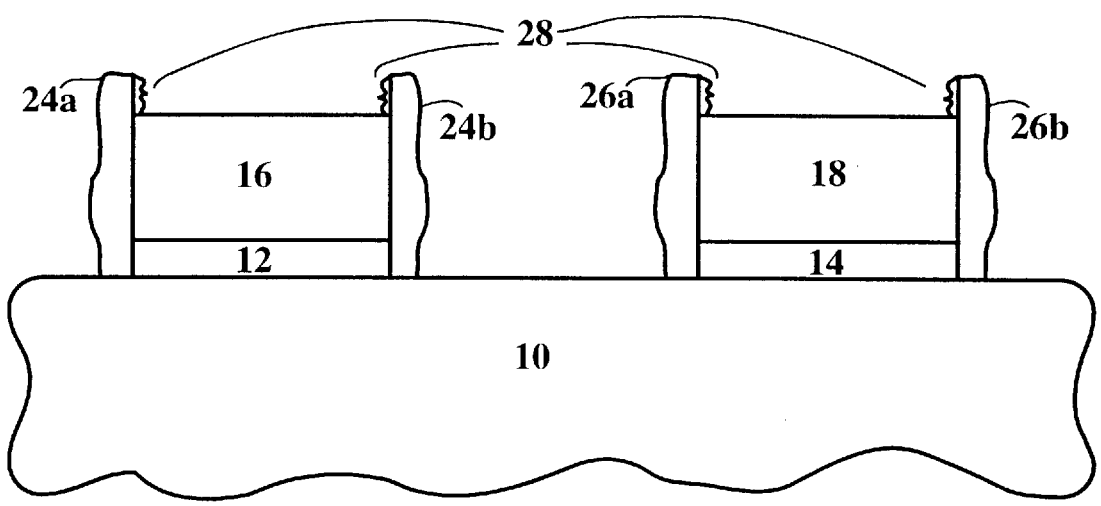
Figure 1C:
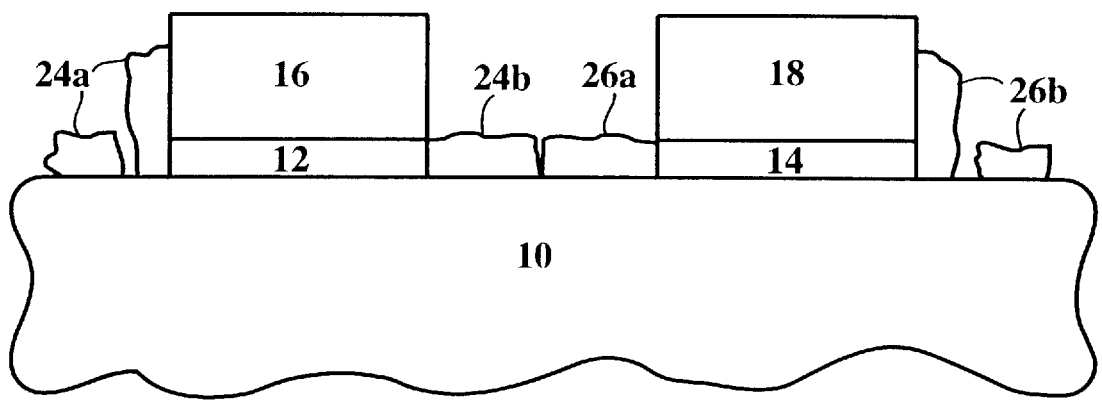
Figure 2A:
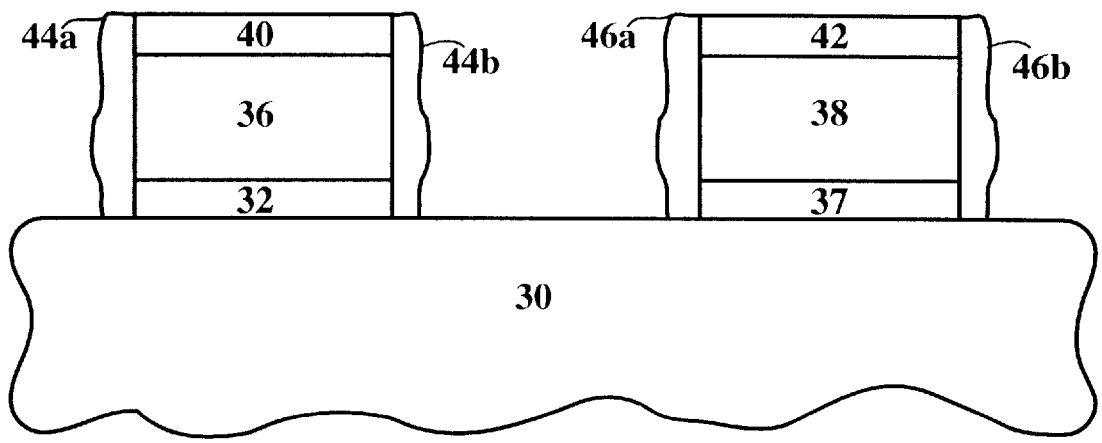
FIGS. 2A–2B are cross sectional views illustrating an SOG etchback process.

With reference now to FIG. 2A, a cross sectional view of a semiconductor substrate 30 having features formed thereon is shown. Semiconductor substrate 30 has a first alloy layer 32 and a second alloy layer 34 formed thereon. A first metal line 36 is disposed on top of first alloy layer 32, and a second metal line 38 is disposed on top of second alloy layer 34. Photoresist layers 40 and 42 cover first and second metal lines 36 and 38, respectively. It will be understood that various other features, such as, for example, an oxide layer on semiconductor wafer 30, are not shown for purposes of clarity.

With reference still to FIG. 2A, first metal line 36 has sidewall polymers 24a and 24b formed thereon. Likewise, second metal line 38 has sidewall polymers 46a and 46b formed thereon. Sidewall polymers 44a, 44b, 46a, and 46b are formed during the metal etch step used to form metal lines 36 and 38. Specifically, sidewall polymers 44a, 44b, 46a, and 46b are formed by the etching species such as, for example, $CHF_3$, $C_2H_6$, and the like, used to form metal lines 36 and 38. Additionally, sidewall polymers 44a, 44b, 46a, and 46b contain carbon present in the photoresist mask which defines the metal etch step. As a result, sidewall polymers 44a, 44b, 46a, and 46b are comprised of long-chain hydrocarbon polymers. Furthermore, sidewall polymers often have metallic components embedded therein. The metal components were liberated during the metal etch step from, for example, the metal of metal lines 36 and 38, or the metal in alloy layers 32 and 34.

In the present embodiment, semiconductor wafer 30 is placed in an ashing environment such as, for example, a reactive ion etching chamber. Although such an ashing environment is used in the present embodiment, the present invention is also well suited to the use of various other well known ashing environments. In the present embodiment, the ashing environment operates at a pressure of approximately 1.2 Torr and a power of approximately 1000 Watts.

Next, in the present embodiment, the present invention introduces $O_2$ and $CF_4$ into the ashing environment. The present embodiment introduces $O_2$ at a flow rate of approximately 800 standard cubic centimeters per minute (SCCM). $CF_4$ is introduced at a flow rate of approximately 80 SCCM, in the present embodiment. The present invention then introduces $H_2O$ vapor into the ashing environment at a flow rate of approximately 80 SCCM. Although such flow rates are used in the present embodiment, the present invention is also well suited to varying the flow rates of the gases which are introduced into the ashing environment.

By adding $H_2O$ vapor to the ashing environment, the present invention achieves ashing selectivity. That is, the present invention ashes sidewall polymer material without deleteriously etching other species such as metals or oxides. Additionally, the present invention facilitates the removal of photoresist.

Figure 3:
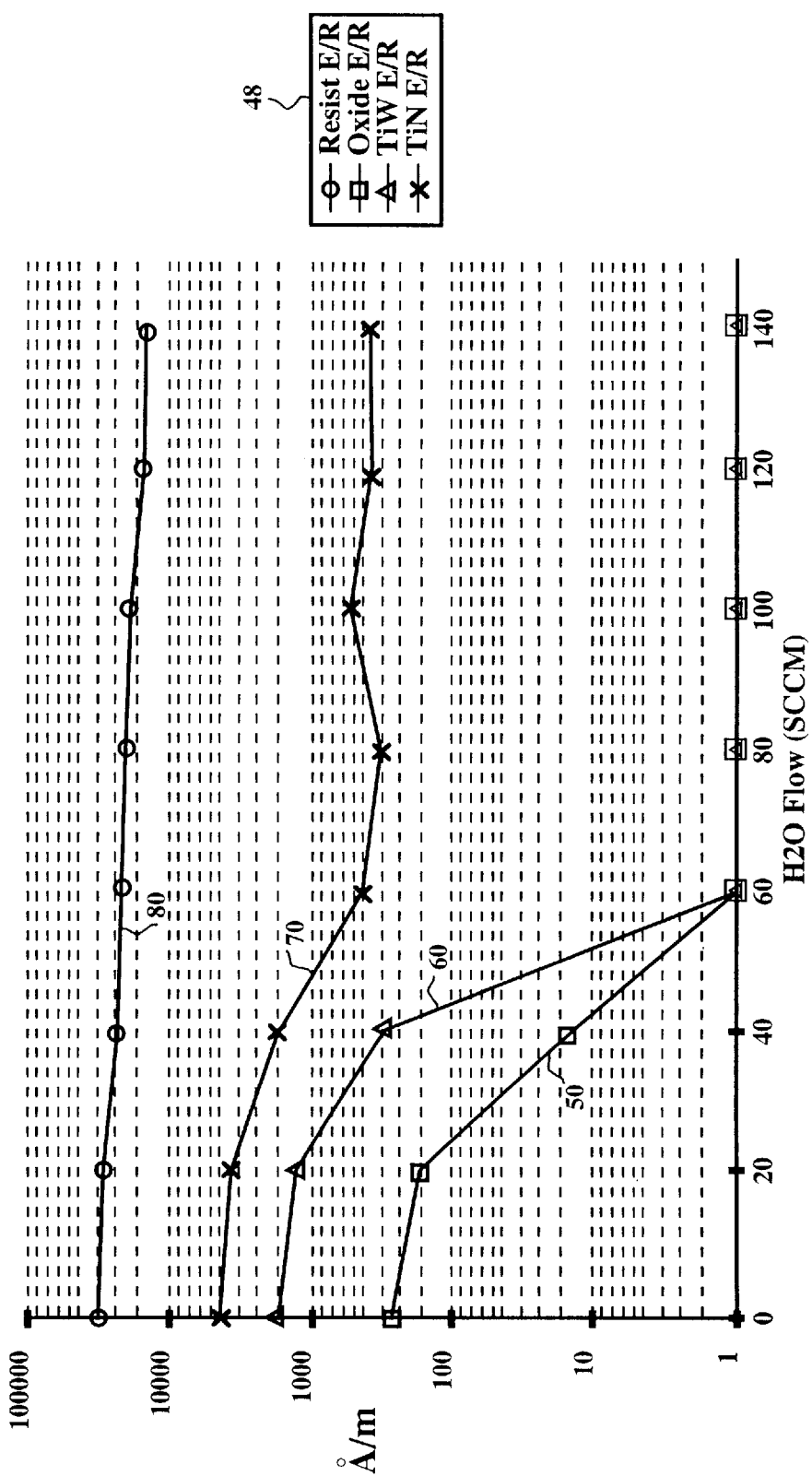
FIG. 3 is a graph of ashing/etching selectivity vs. $H_2O$ water vapor flow rate in accordance with the present claimed invention.

With reference next to FIG. 3, a graph of ashing etching selectivity vs. $H_2O$ vapor flow rate is shown. In the graph of FIG. 3, the etch or ash rate in angstroms per minute vs. a varying flow rate of $H_2O$ vapor in SCCM for several species of material is shown. As shown by legend 48, line 50 represents the etch rate of oxide, line 60 represents the etch rate of titanium tungsten (TiW), line 70 represents the etch rate of titanium nitride (TiN), and line 80 represents the ash rate of photoresist. As shown in the graph of FIG. 3, by adding $H_2O$ vapor in accordance with the present invention, the etch rate of the oxide and metal materials drops significantly. More specifically, by flowing 60 SCCM of $H_2O$ vapor into the etching or ashing environment, the present invention reduces the etch rate for both oxide and TiW material to approximately 1 angstrom per minute. Thus, the etch rate of such materials is virtually eliminated. Additionally, by flowing 80 SCCM of $H_2O$ vapor into the etching or ashing environment, the present invention reduces the etch rate for TiN material from approximately 5000 angstroms per minute to approximately 400 angstroms per minute. Thus, etching of TiN material can be controlled by limiting ashing times. Although the present invention reduces the etch rates of the metals, TiW and TiN, and oxides, the present invention does not are significantly reduce the ash rate of photoresist. Although, sidewall polymer material is not shown in the graph of FIG. 3, it is well known that the ashing of photoresist can be used to emulate or give an idea of the rate at which sidewall polymer material will be etched. That is, sidewall polymer material contains substantial amounts of carbon and its ash rate can be predicted based upon the ash rate of photoresist. Therefore, the graph of FIG. 3 indicates that the sidewall polymer material will be ashed at a rate which is significantly higher than the rate at which other materials, such as oxides and metals, will be etched. Moreover, the present invention provides for high ash rates of photoresist and sidewall polymer material with virtually no etching TiW or oxides.

Figure 2B:
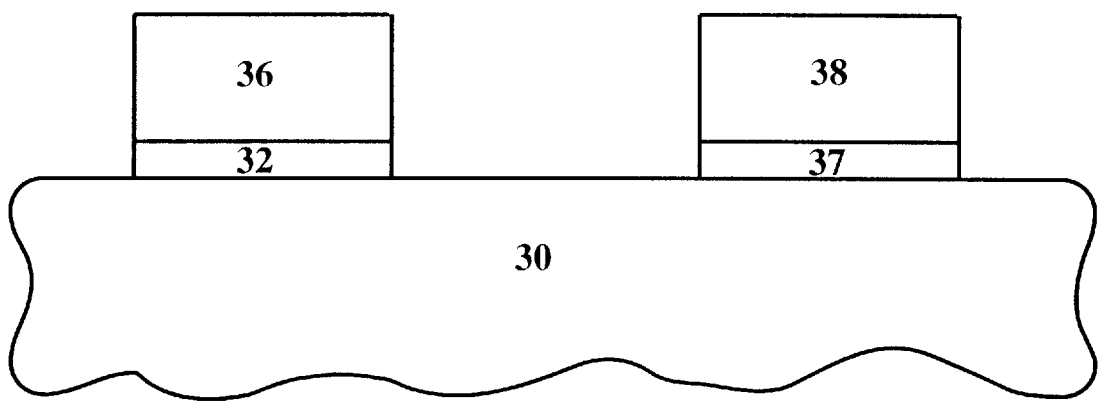

With reference next to FIG. 2B, a cross sectional view of semiconductor substrate 30 and the features of FIG. 2A is shown after an ashing step in accordance with the present invention. As shown in FIG. 2B, photoresist material 40 and 42 of FIG. 2A and sidewall polymers 44a, 44b, 46a, and 46b all of FIG. 2A are also removed. Although the photoresist and sidewall polymer material are removed in FIG. 2B, first and second metal lines 36 and 38 and first and second alloy layers 32 and 34 remain intact. Likewise, oxide layers, not shown, are not etched or damaged by the ashing step of the present invention. Thus, the present invention ashes photoresist and sidewall polymer material without damaging other materials.

Although the present embodiment, recites the addition of $CF_4$ to the ashing environment, the present invention is also well suited to not introducing $CF_4$ into the ashing environment. Furthermore, although the present invention specifically recites removing sidewall polymer material from the side of metal lines, the present invention is also well suited to other sidewall polymer removal applications. Such applications include, but are not limited to, removing sidewall polymer material from the interior of vias.

Thus, the present invention provides a method which effectively removes sidewall polymer material without deleteriously etching other material.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method for enhancing sidewall polymer removal comprising the steps of:
   introducing $O_2$ into an ashing environment at a flow rate of approximately 800 standard cubic centimeters per minute (SCCM);
   introducing $CF_4$ into said ashing environment at a flow rate of approximately 80 SCCM;
   introducing $H_2O$ vapor into said ashing environment at a flow rate of approximately 80 SCCM such that etching of oxide material is suppressed; and
   selectively ashing, within said ashing environment, sidewall polymer material.

2. The method as recited in claim 1 wherein said step of ashing sidewall polymer material within said ashing environment further comprises the step of:
   ashing sidewall polymer material within said ashing environment wherein said ashing environment is at a pressure of approximately 1.2 Torr.

3. The method as recited in claim 1 wherein said step of ashing sidewall polymer material within said ashing environment further includes the step of:
   ashing photoresist material present in said ashing environment.

4. A process for enhancing sidewall polymer removal comprising the steps of:
   introducing $O_2$ into an ashing environment;
   introducing $H_2O$ vapor into said ashing environment such that etching of oxide material is suppressed; and
   selectively ashing, within said ashing environment, sidewall polymer material.

5. The process as recited in claim 4 further comprising the step of:
   introducing $CF_4$ into said ashing environment.

6. The process as recited in claim 4 wherein said step of introducing $O_2$ into an ashing environment further comprises the step of:
   introducing said $O_2$ at a flow rate of approximately 800 standard cubic centimeters per minute (SCCM).

7. The process as recited in claim 5 wherein said step of introducing $CF_4$ into an ashing environment further comprises the step of:
   introducing said $CF_4$ at a flow rate of approximately 80 standard cubic centimeters per minute (SCCM).

8. The process as recited in claim 4 wherein said step of introducing $H_2O$ into an ashing environment further comprises the step of:
   introducing said $H_2O$ at a flow rate of approximately 80 standard cubic centimeters per minute (SCCM).

9. The process as recited in claim 4 wherein said step of ashing sidewall polymer material within said ashing environment further comprises the step of:
   ashing sidewall polymer material within said ashing environment at a pressure of approximately 1.2 Torr.

10. The process as recited in claim 4 wherein said step of ashing sidewall polymer material within said ashing environment further includes the step of:
    ashing photoresist material present in said ashing environment.

11. A method for removing sidewall polymer material without significantly etching other materials comprising the steps of:
    placing a semiconductor wafer having sidewall polymer material formed thereon into an ashing environment; said semiconductor wafer having metal features and oxides formed thereon;
    introducing $O_2$ into said ashing environment;
    introducing $H_2O$ vapor into said ashing environment such that etching of oxide material is suppressed;
    selectively ashing said features on said semiconductor wafer such that said sidewall polymer material is ashed at a rate substantially greater than the rate at which said metal features and said oxides are etched; and
    continuing said selective ashing of said features on said semiconductor wafer until said sidewall polymer material is removed from said semiconductor wafer.

12. The method as recited in claim 11 further comprising the step of:
    introducing $CF_4$ into said ashing environment.

13. The method as recited in claim 11 wherein said step of introducing $O_2$ into an ashing environment further comprises the step of:
    introducing said $O_2$ into said ashing environment at a flow rate of approximately 800 standard cubic centimeters per minute (SCCM).

14. The method as recited in claim 12 wherein said step of introducing $CF_4$ into an ashing environment further comprises the step of:

introducing said $CF_4$ into said ashing environment at a flow rate of approximately 80 standard cubic centimeters per minute (SCCM).

15. The method as recited in claim 11 wherein said step of introducing $H_2O$ into an ashing environment further comprises the step of:

introducing said $H_2O$ into said ashing environment at a flow rate of approximately 80 standard cubic centimeters per minute (SCCM).

16. The method as recited in claim 11 wherein said step of selectively ashing said features on said semiconductor wafer further comprises the step of:

selectively ashing said features on said semiconductor wafer within said ashing environment at a pressure of approximately 1.2 Torr.

17. The method as recited in claim 11 wherein said step of selectively ashing said features on said semiconductor wafer further comprises the step of:

ashing photoresist material present on said semiconductor wafer.

* * * * *